United States Patent [19]
Ahn

[11] Patent Number: 5,291,506
[45] Date of Patent: Mar. 1, 1994

[54] SEMICONDUCTOR LASER MADE OF GROUP II-VI COMPOUNDS

[75] Inventor: Do Y. Ahn, Seoul, Rep. of Korea

[73] Assignee: GoldStar Co., Ltd, Rep. of Korea

[21] Appl. No.: 998,072

[22] Filed: Dec. 28, 1992

[30] Foreign Application Priority Data

Dec. 28, 1991 [KR] Rep. of Korea ............... 1991-24948

[51] Int. Cl.[5] ............................................. H01S 3/18
[52] U.S. Cl. ........................................ 372/43; 372/45; 257/78
[58] Field of Search ................................ 372/43–50; 257/76, 78

[56] References Cited

U.S. PATENT DOCUMENTS

| | | | |
|---|---|---|---|
| 4,607,369 | 8/1986 | Niina et al. | 372/46 |
| 4,794,606 | 12/1988 | Kondow et al. | 372/45 |
| 4,856,013 | 8/1989 | Iwano et al. | 372/45 |
| 4,922,837 | 2/1991 | Sakai et al. | 372/45 |
| 5,010,376 | 4/1991 | Nishimura et al. | 372/45 |
| 5,045,897 | 9/1991 | Ahlgren | 372/45 |
| 5,081,632 | 1/1992 | Migita et al. | 372/45 |
| 5,093,696 | 3/1992 | Kinoshita | 372/48 |
| 5,179,566 | 1/1993 | Iwano et al. | 372/45 |
| 5,182,757 | 1/1993 | Mori et al. | 372/45 |

Primary Examiner—Frank Gonzalez
Attorney, Agent, or Firm—Morgan & Finnegan

[57] ABSTRACT

A semiconductor laser comprising an active layer in which a biaxial compressive strain is generated, to improve an optical gain. The semiconductor laser has a double-heterostructure comprising an active layer of a (Cd,S)Zn(Se,Te) compound, a pair of cladding layers formed beneath and over the active layer and made of a Zn(Se,Te) compound, and a pair of strained layers formed among the active layer and the cladding layers and made of a (Cd,S)Zn(Se,Te) compound. The strained layers is comprised of a Group II-VI compound semiconductor having lattice constants smaller than and band gaps larger than those of the active layer so that a biaxial compressive strain is induced in the active layer, thereby enabling the optical gain to be improved. It is possible to provide semiconductor lasers which can be practically used at a room temperature.

6 Claims, 2 Drawing Sheets

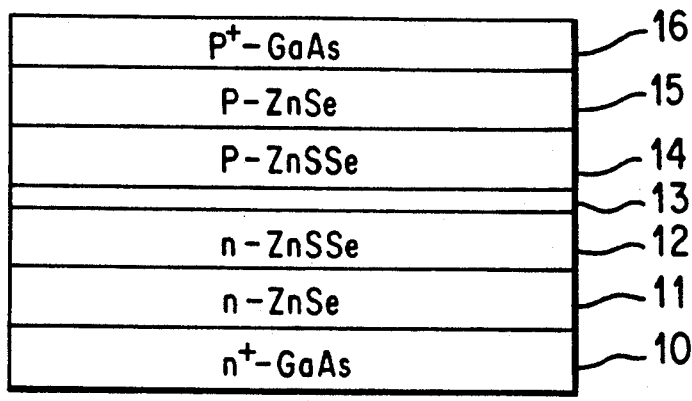
FIG. 1
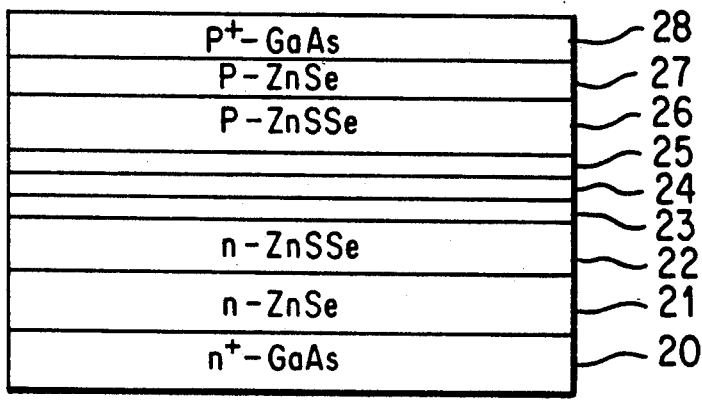
FIG. 2
| MATERIAL | LATTICE CONSTANT [a] | BAND GAB (Eg) |
|---|---|---|
| GaAs | 5.654 [Å] | 1.424 [eV] |
| ZnSe | 5.668 [Å] | 2.58 [eV] |
| CdSe | 6.050 [Å] | 1.84 [eV] |
| ZnS | 5.409 [Å] | 3.54 [eV] |
| CdS | 5.818 [Å] | 2.42 [eV] |
| ZnTe | 6.089 [Å] | 2.26 [eV] |
| CdTe | 6.489 [Å] | 1.45 [eV] |
| BeTe | 5.54 [Å] | |
FIG. 3

SEMICONDUCTOR LASER MADE OF GROUP II-VI COMPOUNDS

BACKGROUND OF THE INVENTION

1. Field of the Invention

The present invention relates to a semiconductor laser comprising an active layer of a Group II-VI compound for generating a biaxial compressive strain.

2. BACKGROUND ART

Recently, optical detection devices such as MO discs and printers have been in greater demand. To meet such a demand, a great deal of efforts have been made for developing semiconductor lasers.

As an example of such semiconductor lasers, there is a semiconductor laser made of a Group II-VI compound of the Periodic Table of Element semiconductor which is illustrated in FIG. 1. As shown in FIG. 1, the semiconductor laser has a multi-layered structure comprising a $n^+$-GaAs substrate 10, a n-Zn Se layer 11, a n-ZnSSe cladding layer 12, a CdZnSe active layer 13, a p-ZnSSe cladding layer 14, a p-ZnSe layer 15 and a $p^+$-GaAs layer 16, all layers being formed in order over the $n^+$-GaAs substrate 10. The CdZnSe active layer 13 forms a lattice alignment with the ZnSSe cladding layers 12 and 14 and thus have a double-heterostructure (DH structure). The active layer 13 and the cladding layers 12 and 14 can be formed by a crystal growth of ZnSe. The Group II-VI compound semiconductor laser with the above-mentioned structure operates in a manner that the active layer 13 and the cladding layers 12 and 14 are in a lattice alignment state. Such an operation manner is the same as the operation principle of the Group III-V compound semiconductor lasers which have been commonly used already.

Semiconductor laser oscillating a wave with a green color wavelength of wide use have been also developed which has an active laser for oscillating a wave having a green color wavelength of 480 nm to 550 nm. However, these semiconductor lasers have a difficulty in manufacture. That is, it is difficult to make such semiconductor lasers by using a semiconductor compound of a Group III-V compound. On the other hand, a Group II-VI compound semiconductor not only makes it difficult to make the semiconductor lasers, but also requires a complex refinement. In particular, the Group II-VI compound semiconductor is poor in optical gain characteristic which is the most important characteristic of semiconductor lasers, as compared with the Group III-V semiconductor compound. This makes it difficult to use practically the Group II-VI compound semiconductor. The Group II-VI compound semiconductor itself has an optical gain lower than a GaAs compound semiconductor by three times to five times under the same condition. As a result, it exhibits a high critical current density and thereby requires a current of several amperes for an operation at a room temperature. The most known techniques are at such a level that the semiconductor lasers are operated at a low temperature of about 700° K. For achieving operations of semiconductor lasers at a room temperature, new methods capable of providing an improvement in optical gain are strongly needed.

SUMMARY OF THE INVENTION

Therefore, an object of the invention is to provide a semiconductor laser comprising an active layer and barrier layers which are of a Group II-VI compound semiconductor with a controlled composition for inducing a biaxial compressive strain, thereby capable of achieving an improvement in optical gain.

In accordance with the present invention, this object can be accomplished by providing a laser diode of a Group II-VI compound semiconductor with a double-heterostructure, comprising: a substrate doped with ions of a predetermined conductivity; at least one lower cladding layer formed over the substrate and doped with ions of the same conductivity as the substrate, the lower cladding layer being comprised of a Group II-VI compound semiconductor; an active region layer formed over the lower cladding layer and having a biaxial compressive strain for improving an optical gain characteristic, the active region layer being comprised of a Group II-VI compound semiconductor; at least one upper cladding layer formed over the active region layer and doped with ions of the opposite conductivity to the lower cladding layer, the upper cladding layer being comprised of a Group II-VI compound semiconductor; and a capping layer formed over the upper cladding layer and doped with ions of the opposite conductivity to the substrate.

BRIEF DESCRIPTION OF THE DRAWINGS

Other objects and aspects of the invention will become apparent from the following description of embodiments with reference to the accompanying drawings in which:

FIG. 1 is a schematic sectional view of a conventional semiconductor layer;

FIG. 2 is a sectional view of a semiconductor laser in accordance with the present invention;

FIG. 3 is a table describing lattice constants and band gaps of compound semiconductors comprised of Group II-VI compounds in accordance with the present invention;

DETAILED DESCRIPTION OF THE INVENTION

Figure 4A:
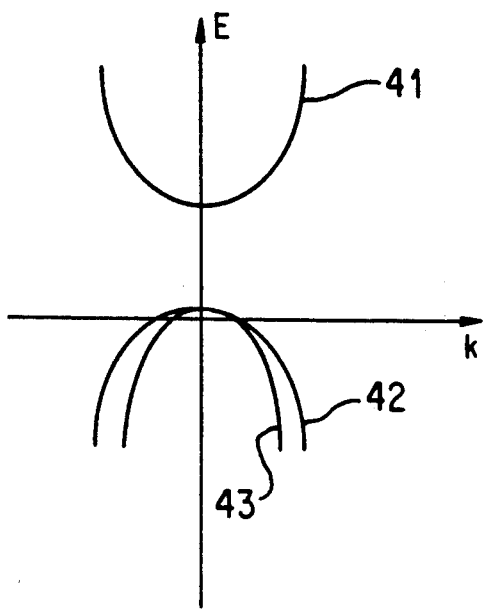
FIGS. 4A and 4B are graphs illustrating variations in band structure when a strain is applied.

Referring to FIG. 2, there is illustrated a semiconductor laser in accordance with the present invention.

The semiconductor laser shown in FIG. 2 can be manufactured by the following processes. That is, over $n^+$-GaAs substrate 20 are formed a n-ZnSe layer 21 and a n-ZnSSe cladding layer 22, in this order. Thereafter, a CdZnSSe barrier layer 23 as a n type strained layer is formed over the n-ZnSe cladding layer 22, to have a thickness of 100 Å to 1 μm. Over the n-CdZnSSe barrier layer 23, a CdZnSe active layer 24 is formed to have a thickness of 50 Å to 300 Å. A CdZnSSe barrier layer 25 as a p type strained layer is then formed over the n-CdZnSSe barrier layer 23, to have a thickness of 100 Å to 1 μm. Over the p-CdZnSSe barrier layer 25 are finally formed a p-ZnSSe cladding layer 26, a p-ZnSe layer 27 and a p-GaAs layer, in this order.

By the strain layers 23 and 25 interposed between the cladding layer 22 and the active layer 24 and between the active layer 24 and the cladding layer 26, a biaxial compressive strain is induced at the active layer 24 so that the optical gain which is the intrinsic semiconductor characteristic can be improved.

Herein, the word "strain" means that the lattice of active layer 24 is misaligned from the lattices of barrier layers 23 and 25 within the elastic limit of the active layer. The word "biaxial compressive strain" means the strain generated when the lattice spacing of active layer 24 is larger than those of barrier layers 23 and 25.

For preventing the strain generated by the strained layers 23 and 25 from affecting as a defect, the semiconductor laser of the present invention should have an elasticity. Such as elasticity can be obtained by making the active layer 24 have a thickness of several hundreds Å or less.

Preferably, a semiconductor suitable for providing a semiconductor laser for oscillating a green wave has a double-heterostructure comprising the active layer 24 which is made of a ternary compound semiconductor of (Cd,S)Zn(Se,Te) and having a band gap of 2 eV to 3 eV and the barrier layers 23 and 25 which are made of a ternary compound semiconductor of (Cd,S)Zn(Se,Te) and having a band gap higher than and a lattice spacing smaller than those of the active layer 24. In this case, the barrier layers may have a multi-layered structure, so as to obtain a better biaxial compressive strain.

Referring to FIG. 3, there is illustrated a table describing lattice constants and band gaps of compound semiconductors of Group II-VI compounds. In accordance with the present invention, a compound semiconductor exhibiting a band gap of 2.58 eV to 2.25 eV corresponding to the green color wave having a wavelength of 480 nm to 550 nm is selected. For example, a compound semiconductor of $Cd_{0.2}Zn_{0.8}Se$ exhibits a band gap Eg of 2.43 eV and a wavelength of 500 nm. After selecting the compound semiconductor having a band gap corresponding to the green color wavelength, the active layer 24 is formed using the selected compound semiconductor, to have a thickness of about 50 Å to 300 Å. At upper and lower surfaces of the active layer 24, the barrier layers 23 and 25 are then grown which have lattice constants smaller than and band gaps larger than those of the active layer 24. By virtue of the difference in lattice constant, a biaxial compressive strain can be generated. The generated strain contributes to a great increase in optical gain in the active layer 24.

Figure 4B:
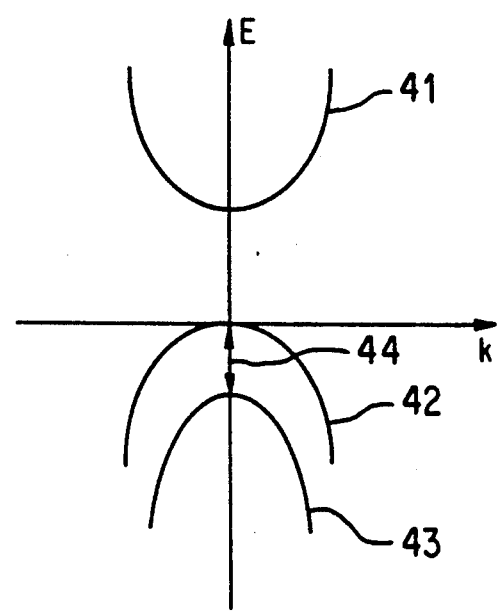

FIGS. 4A and 4B illustrate variations in band structure when a strain is applied. FIG. 4A is zero strain graphs, whereas FIG. 4B is biaxial compressive strain graphs. In FIGS. 4A and 4B, the horizontal coordinate axes k indicate a constant, while the vertical coordinate axes E indicates an energy level. The reference numeral 41 denotes a conduction band, 42 a heavy hole band, and 43 a light hole band.

When the lattice spacing of the active layer 24 is smaller than those of the barrier layer 23 and 25, a biaxial compressive strain is generated within the elastic limit of active layer (50 Å to 300 Å). At this case, the generated strain serves to deform the band structures of the heavy holes 42 and light holes 43 of the active layer 24. That is, the heavy holes 42 are changed into a ground state with an energy level lower than that of the case where no strain is generated.

On the other hand, the optical gain is proportional to the recombination rate (TE polarization) of heavy holes in a valence band with electrons in a conduction band. The recombination rate more increases at a lower ground energy of hole. As the absolute value 44 (FIG. 4B) of biaxial compressive strain increases, the transition probability increases proportionally, thereby causing the optical gain to increase.

Figure 5:
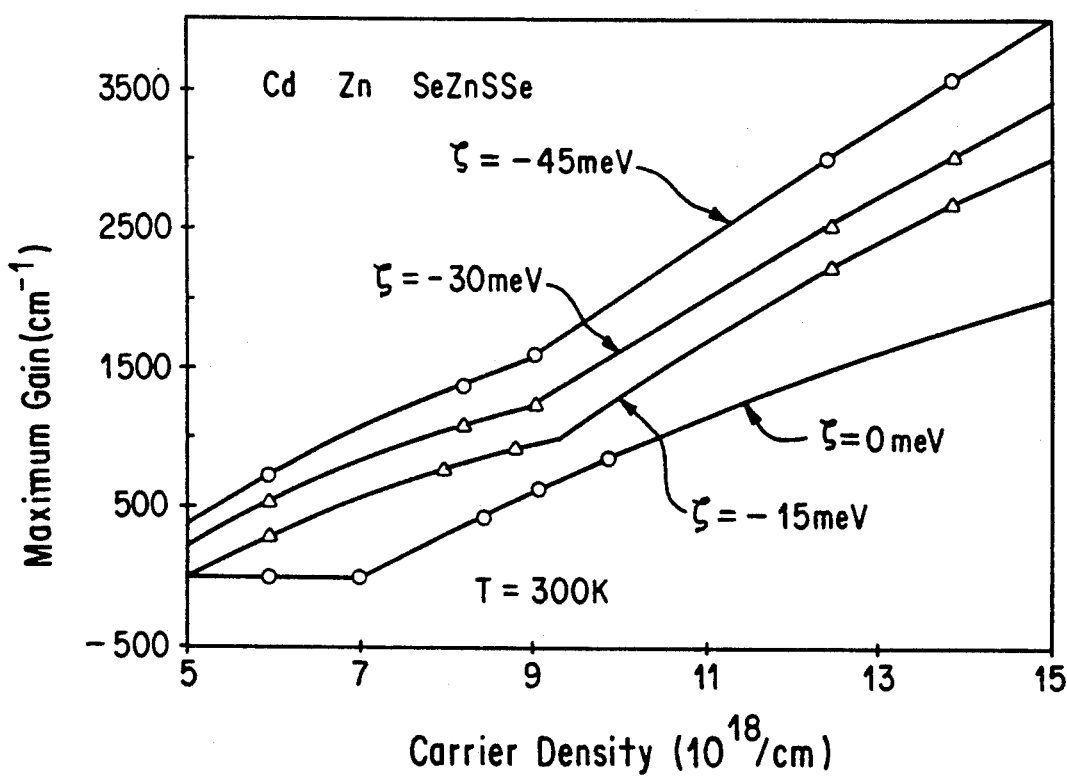
FIG. 5 is an injected electron number-gain characteristic curve which is obtained by calculating the variation in gain in a quantum mechanics manner.

FIG. 5 is an injected electron number-gain characteristic curve which is obtained by calculating the variation in gain in a quantum mechanics manner. The characteristic curve shows the relationship between the optical gain and the carrier density when a biaxial compressive strain is induced in the active layer 24 which is of $Cd_{0.2}Zn_{0.8}Se$ and has a thickness of about 100 Å. It also shows that the strain is higher at the higher absolute value of strain potential $\zeta$. From the characteristic curve, it can be also found that the optical gain is considerably improved. When the strain potential $\zeta$ is not higher than zero, the strain is proportional to the lattice constant difference between the barrier layer 23 and 25. for example, the optical gain at the strain potential $\zeta$ of $-30$ meV is higher than the optical gain at no strain, by three times or more.

As apparent from the above description, the present invention provides a semiconductor laser comprising an active layer and a pair of strained layers disposed beneath and over the active layer and made of a Group II-VI compound semiconductor with a controlled composition capable of inducing a biaxial compressive strain in the active layer, thereby improving the optical gain. Accordingly, it is possible to provide semiconductor lasers which can be practically used at a room temperature.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A laser diode of a Group II-VI compound of the Periodic Table of Element semiconductor with a double-heterostructure, comprising:
   a substrate doped with ions of a predetermined conductivity;
   at least one lower cladding layer formed over the substrate and doped with ions of the same conductivity as the substrate, the lower cladding layer being comprised of a Group II-VI compound semiconductor;
   an active region layer formed over the lower cladding layer and having a biaxial compressive strain for improving an optical gain characteristic, the active region layer being comprised of a Group II-VI compound semiconductor;
   at least one upper cladding layer formed over the active region layer and doped with ions of the opposite conductivity to the lower cladding layer, the upper cladding layer being comprised of a Group II-VI compound semiconductor; and
   a capping layer formed over the upper cladding layer and doped with ions of the opposite conductivity to the substrate.

2. A laser diode in accordance with claim 1, wherein the substrate and the capping layer are comprised of a GaAs.

3. A laser diode in accordance with claim 1, wherein the cladding layer is comprised of a Zn(Se,Te) and the active region layer is comprised of a (Cd,S)Zn(Se,Te)

4. A laser diode in accordance with claim 1, wherein the active region layer comprises:

at least one lower barrier layer formed over the lower cladding layer and doped with ions of the same conductivity as the lower cladding layer;

an active layer formed over the lower barrier layer and comprised of a undoped compound semiconductor; and at least one upper barrier layer formed over the active layer and doped with ions of the same conductivity as the upper cladding layer, the upper and lower barrier layers having lattice constants smaller than and band gaps larger than those of the active layer.

5. A laser diode in accordance with claim 4, wherein the active layer has a thickness of 50 Å to 300 Å for exhibiting an elasticity.

6. A laser diode in accordance with claim 4, wherein the active layer has a band gap of 480 nm to 550 nm.

* * * * *